United States Patent
Joo et al.

[11] Patent Number: 6,097,037
[45] Date of Patent: Aug. 1, 2000

[54] THIN FILM TRANSISTOR HAVING A CONTINUOUS CRYSTALLIZED LAYER INCLUDING THE CHANNEL AND PORTIONS OF SOURCE AND DRAIN REGIONS

[76] Inventors: Seung-ki Joo, 22-201, Sampoong Apt., 1685, Seocho-dong, Seocho-ku; Tae-Hyung Ihn, 44-64, Sadang-dong, Dongiak-ku, both of Seoul, Rep. of Korea

[21] Appl. No.: 09/074,606

[22] Filed: May 8, 1998

[30] Foreign Application Priority Data

Nov. 12, 1997 [KR] Rep. of Korea .................. 97-59378

[51] Int. Cl.⁷ ............................................. H01L 31/036
[52] U.S. Cl. ........................... 257/55; 257/57; 257/63; 257/64; 257/65; 257/66; 257/69; 257/70; 257/59
[58] Field of Search ..................... 257/55–69, 70

[56] References Cited

U.S. PATENT DOCUMENTS 5,403,772 4/1995 Zhang et al. .
5,426,064 6/1995 Zhang et al. .
5,501,989 3/1996 Takayama et al. .

OTHER PUBLICATIONS

Lee, Seok–Woon; Yoo–Chan Jeon; and Seung–ki Joo. "Pd Induced Lateral Crystallization of Amorphous Si Thin Films," Appl. Phys. Lett. 66 (13), Mar. 27, 1995, pp. 1671–1673.

*Primary Examiner*—Fetsum Abraham
*Attorney, Agent, or Firm*—Long Aldridge & Norman LLP

[57] ABSTRACT

A transistor includes an MILC (metal-induced lateral crystallization) region formed on a substrate with a semiconductor material and including a channel region, and a plurality of MIC (metal-induced crystallization) regions formed on the sides of the MILC region with a semiconductor material, wherein at least one boundary between the MILC region and one of the MIC regions is located outside the channel region. A method of fabricating a transistor includes the steps of forming an MILC (metal-induced lateral crystallization) region on a substrate using a semiconductor material, the MILC region including a channel region, and forming a plurality of MIC (metal-induced crystallization) regions formed on sides of the MILC region using a semiconductor material, wherein at least one boundary between the MILC region and one of the MIC regions is located outside the channel region.

16 Claims, 11 Drawing Sheets

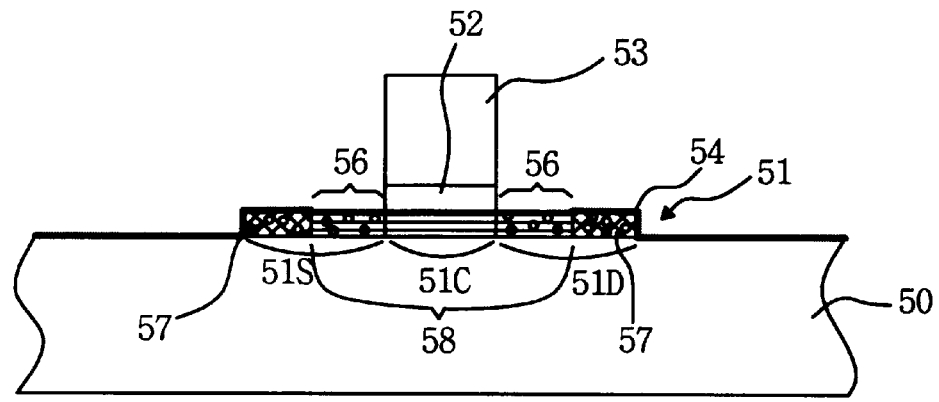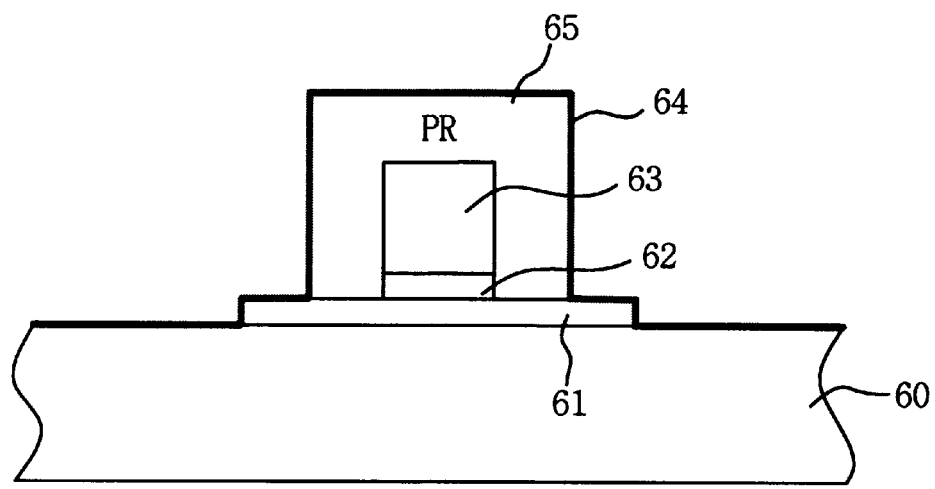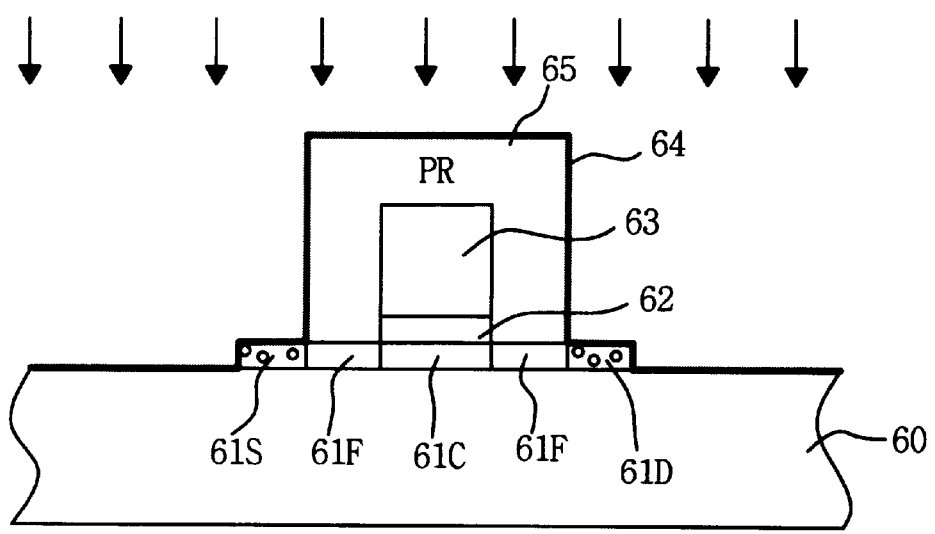

THIN FILM TRANSISTOR HAVING A CONTINUOUS CRYSTALLIZED LAYER INCLUDING THE CHANNEL AND PORTIONS OF SOURCE AND DRAIN REGIONS

BACKGROUND OF THE INVENTION

1. Field of Invention

The present invention relates to a thin film transistor (TFT) and method of fabricating the same and more particularly, to a TFT and its fabricating method having a Metal Induced Crystallization (MIC) region crystallized by an MIC process and a Metal Induced Lateral Crystallization (MILC) region crystallized by an MILC process wherein the boundary between the MIC and MILC regions is located outside a channel region of the TFT.

2. Discussion of Related Art

A method of crystallizing amorphous silicon using heat treatment at a low temperature after a certain kind of a metal layer has been deposited on the amorphous silicon is known as an MIC process. The MIC process is beneficial due to the low temperature crystallization of amorphous silicon. However, the MIC process has not been applied to electronic devices because of an inflow of metal into the thin film of crystallized silicon formed underneath the metal layer, which causes the intrinsic characteristics of amorphous silicon to deteriorate.

A different method of crystallizing amorphous silicon by MILC has been proposed to address this problem. FIG. 1A to FIG. 1D show examples of schematic cross-sectional views for explaining an MILC process.

Referring to FIG. 1A, an amorphous silicon layer 11 to be crystallized is formed to a thickness of 1000 Å on an insulating layer (not shown). Metal patterns, such as nickel patterns 13, are formed on the amorphous silicon layer 11.

Referring to FIG. 1B, the amorphous silicon layer 11 is crystallized when heat is applied to the nickel patterns 13 at a temperature of 350° C.–500° C. On the regions "A" of the amorphous silicon layer 11 having the nickel patterns 13 thereon, nickel silicide 14 is formed as the nickel in the nickel patterns 13 reacts with the amorphous silicon in the layer 11. The nickel silicide 14 becomes a seed for crystallization and promotes the crystallization of the amorphous silicon layer 11. The "A" regions crystallized directly by the nickel silicide 14 become the MIC regions.

Referring to FIG. 1C, the boundaries of the "A" regions having crystallized silicon function as a new seed for crystallization and cause lateral crystallization of silicon in the region "B". Since the region "B" has no seed of crystallization and has not been solidified yet, the lateral crystallization of silicon is performed by the MIC regions which have been completely crystallized. That is, the region "B" becomes the MILC region as the crystallization by the nickel silicide 14 is induced in the lateral direction of the MIC region.

FIG. 1D shows a cross-sectional view of a crystallized silicon layer having MIC and MILC regions. Generally, the MILC region have less metal contamination, superior crystals and less coarseness in the crystallized surface thereof, than the MIC regions. Thus, the MILC regions are more suitable to function as channel regions for TFTs.

FIGS. 2A to 2C show a method of fabricating a channel region of a thin film transistor using an MILC process according to a related art.

Referring to FIG. 2A, an amorphous silicon layer as an active layer 21 is deposited on an insulation substrate 20 having a buffer film (not shown) on its upper part, and the active layer 21 is patterned by photolithography and etching. A gate insulation layer 22 and a gate electrode 23 are formed on the active layer 21 by conventional processes.

Referring to FIG. 2B, a nickel layer 24 is formed to a thickness of 20 Å by sputtering nickel on the entire surface of the formed structure. Then a source region 21S and a drain 21D are formed at portions of the active layer 21 by heavily doping the entire surface of the formed structure with impurities. Between the source and drain regions 21S and 21D, a channel region 21C is formed on the substrate 20.

Referring to FIG. 2C, amorphous silicon in the active layer 21 is crystallized by heating the substrate 20 at a temperature of 350° C.–500° C. Then the source and drain regions 21S and 21D on which the nickel layer 24 has been formed become the MIC regions having silicon crystallized by an MIC process. The channel region 21C without the nickel layer 24 formed directly thereon, becomes the MILC region where silicon has been crystallized by an MILC process. Impurities are activated in the source and drain regions 21S and 21D during the heat treatment as amorphous silicon is crystallized in the active layer 21.

In the thin film transistor fabricated by the above-described method according to the conventional art, the channel region 21C has boundaries defined by the crystalline structure of silicon in the MIC regions facing that of silicon in the adjacent MILC region. Since the boundary between the MIC region and the MILC region is located at the junction where the source or drain region meets the channel region, an abrupt difference in the crystal structure appears in the junction and the metal from the MIC region contaminates the adjacent MILC region. Consequently, a trap is formed at such junctions as soon as the TFT is turned on which causes unstable channel regions and deteriorates the characteristics of the thin film transistor.

SUMMARY OF THE INVENTION

Accordingly, the present invention is directed to a thin film transistor and its fabricating method and substantially obviate one or more of the problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve the above-noted and other advantages and in accordance with the purposes of the present invention, as embodied and broadly described, a transistor includes an MILC (metal-induced lateral crystallization) region formed on a substrate with a semiconductor material and including a channel region; and a plurality of MIC (metal-induced crystallization) regions formed on the sides of the MILC region with a semiconductor material, wherein at least one boundary between the MILC region and one of the MIC regions is located outside the channel region.

Furthermore, the present invention is directed to a method of fabricating a transistor, comprising the steps of forming an active layer on a substrate; forming a gate electrode on a portion of the active layer; forming source and drain regions in the active layer using the gate electrode as a mask; forming a metal layer on portions of the active layer, excluding portions of the active layer adjacent the gate electrode; and crystallizing the active layer.

The present invention is further directed to a method of fabricating a transistor, comprising the steps of forming an active layer on a portion of a substrate; forming a gate electrode on a portion of the active layer; forming a metal layer on the active layer excluding portions of the active layer adjacent the gate electrode; forming a source and drain region in the active layer under the metal layer; and crystallizing the active layer.

Moreover, the present invention is directed to a method of fabricating a transistor, comprising the steps of forming an MILC (metal-induced lateral crystallization) region on a substrate using a semiconductor material, the MILC region including a channel region; and forming a plurality of MIC (metal-induced crystallization) regions formed on sides of the MILC region using a semiconductor material, wherein at least one boundary between the MILC region and one of the MIC regions is located outside the channel region.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention, wherein:

FIG. 5A to FIG. 5D show a method of fabricating an MILC TFT according to a third embodiment of the present invention;

FIG. 6A to FIG. 6D show a method of fabricating an MILC TFT according to a fourth embodiment of the present invention;

DETAILED DESCRIPTION OF PREFERRED EMBODIMENTS

Reference will now be made in detail to the preferred embodiments of the present invention, examples of which are illustrated in the accompanying drawings.

FIG. 3A to FIG. 3E show a method of fabricating an MILC TFT (metal induced lateral crystallization TFT) according to the first embodiment of the present invention.

Figure 1A:
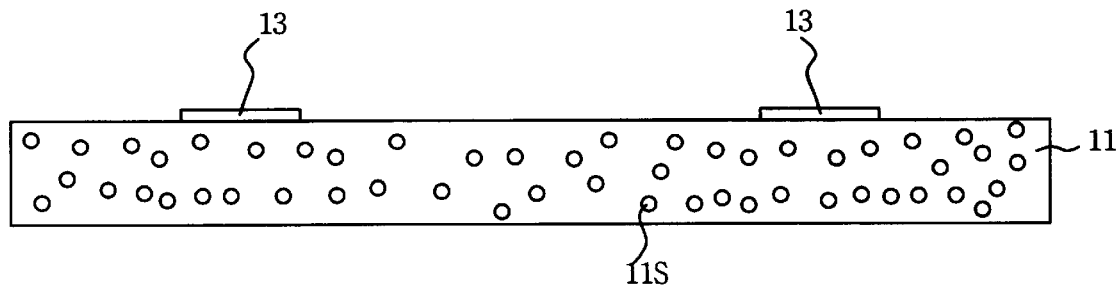
FIG. 1A to FIG. 1D show crystallization of a silicon layer by MIC and MILC processes.
Figure 1B:
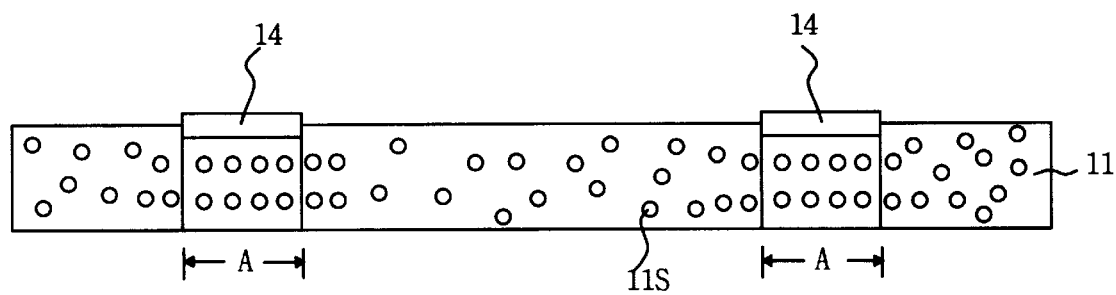
Figure 1C:
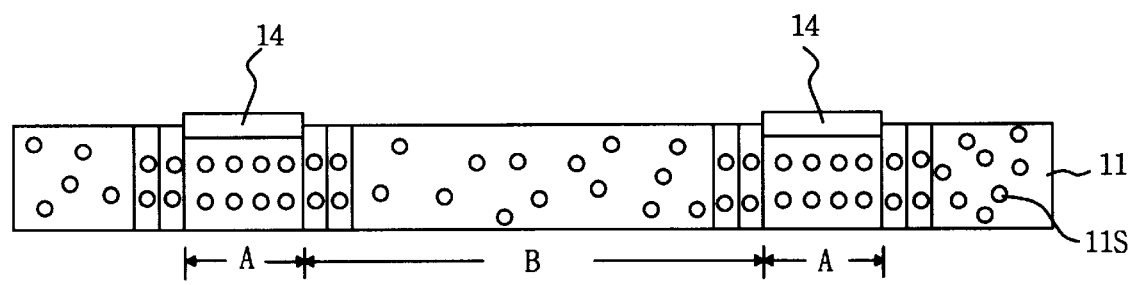
Figure 1D:
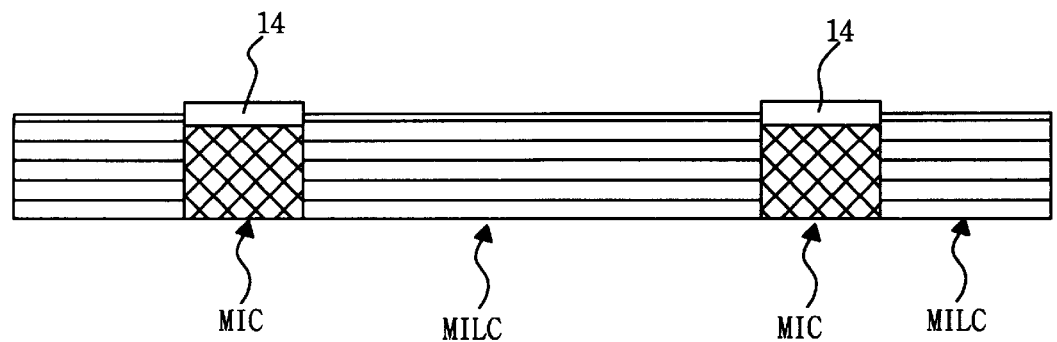
Figure 2A:
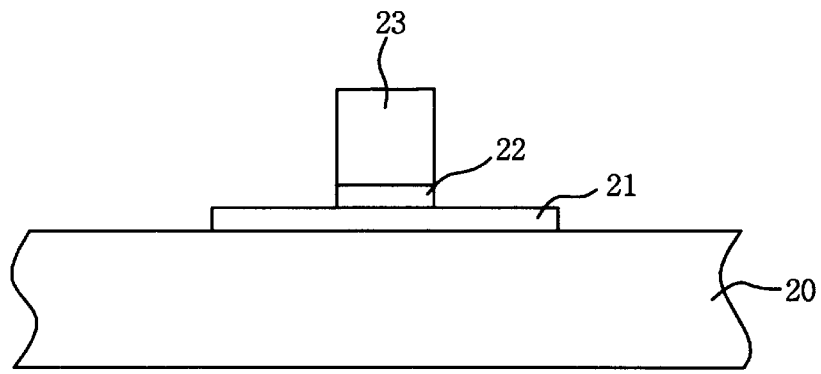
FIG. 2A to FIG. 2C show a method of fabricating an MILC TFT according to a related art.
Figure 2B:
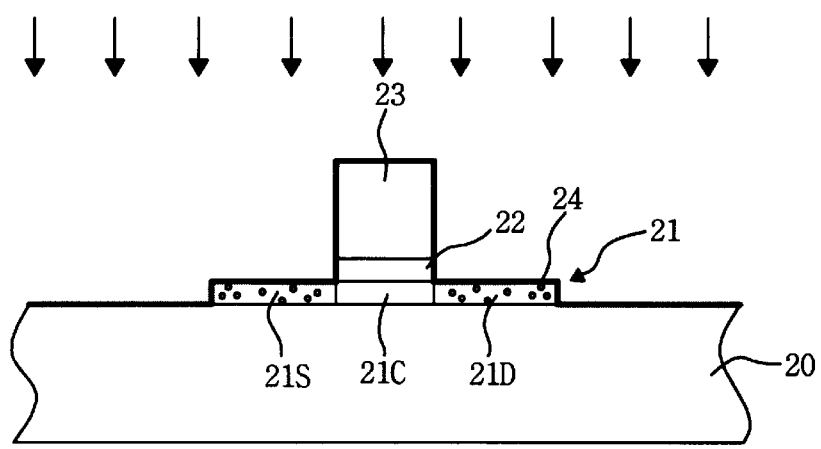
Figure 2C:
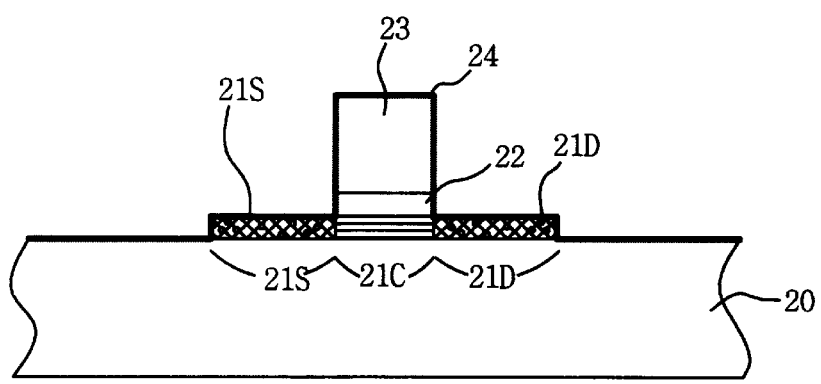
Figure 3A:
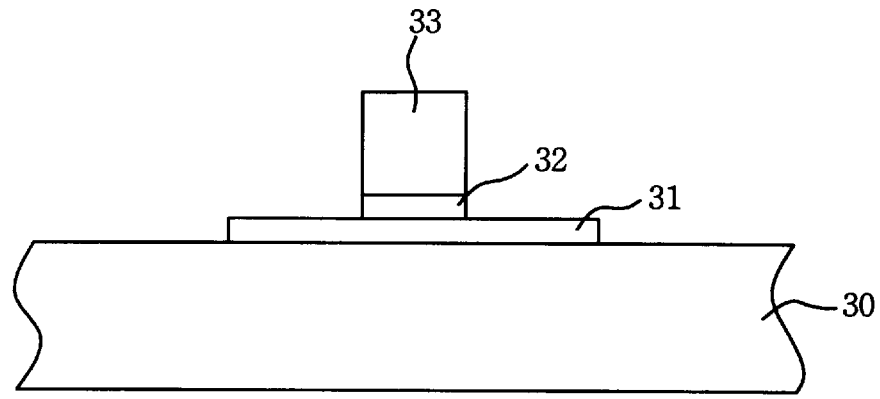
FIG. 3A to FIG. 3E show a method of fabricating an MILC TFT according to a first embodiment of the present invention.

Referring to FIG. 3A, an amorphous silicon layer as an active layer 31 is formed on an insulation substrate 30 having a buffer film (not shown) thereon. The active layer 31 is deposited by LPCVD (Low Pressure Chemical Vapor Deposition) with a thickness of about 1000 Å and patterned by photolithography. Then, an insulating layer, such as a gate insulating layer 32, is formed to a thickness of about 1000 Å by ECR-PECVD (Electron Cyclotron Resonance—Plasma Enhanced Chemical Vapor Deposition). A metal layer for forming a gate electrode 33 is deposited on the gate insulating layer 32 to a thickness of about 2000 Å by sputtering. The metal layer is patterned by using photolithography to form the gate insulating layer 32. The gate electrode 33 is used as an etch mask to etch the insulating layer 32.

Figure 3B:
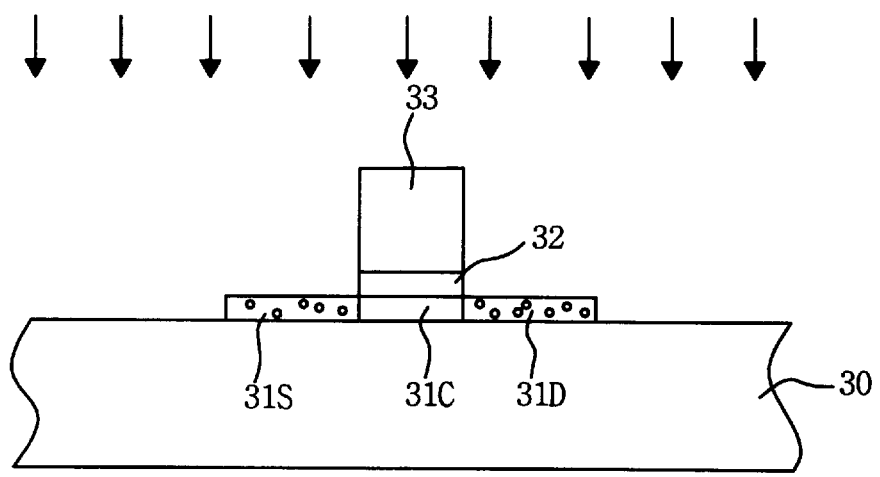

Referring to FIG. 3B, source and drain regions 31S and 31D are formed in portions of the active layer 31 by doping heavily the entire surface of the substrate 30 with impurities, wherein the gate insulating layer 32 and/or the gate electrode 33 function as a doping mask.

Figure 3C:
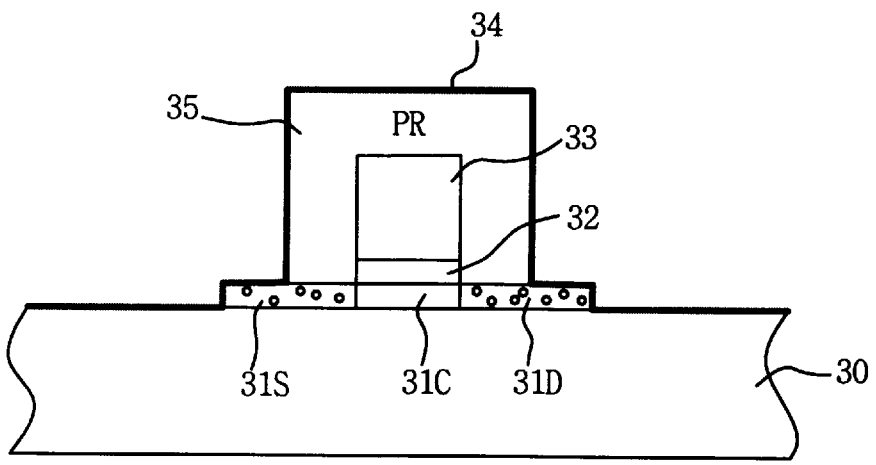

Referring to FIG. 3C, the entire surface of the formed structure is coated with photoresist PR. A photoresist pattern 35 with the length which is about 0.02 µm longer than the gate electrode length, is defined by patterning the photoresist PR with a photo process. Although the language "length" has been and will be been used to describe a size dimension of a photoresist pattern and gate electrode, it is contemplated that other descriptions, such as "width", can be used to describe the same. That is, it is mainly desirable to describe that the photoresist pattern 35 extends in a horizontal direction 0.02 µm more than the gate electrode as shown in FIG. 3C. Then a metal layer, such as a nickel layer 34, having a thickness of 10 Å to 200 Å is formed by sputtering nickel on the formed structure. Here and other embodiments described below, nickel can be substituted with one of Pd, Ti, Ag, Au, Al, Sb, Cu, Co, Cr, Mo, Ir, Ru, Rh, Cd, Pt, etc.

Figure 3D:
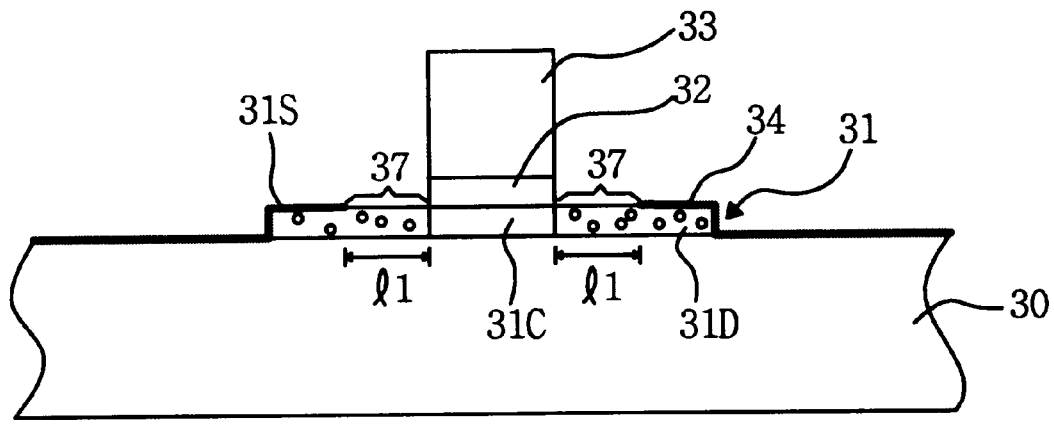

Referring to FIG. 3D, the photoresist pattern 35 is removed by a LIFT-OFF process such that the nickel layer 34 coated directly on a photoresist pattern 35 is removed to form nickel off-set regions 37 where portions of the active layer are without the nickel layer 34. As a result of the LIFT-OFF process, the length "l1" of each nickel off-set region 37 equals 0.01 µm to 5 µm since the photoresist pattern 35 is longer (or wider) than the gate electrode 33 by 0.02 µm to 10 µm.

In a conventional method including steps of depositing and patterning the deposited metal by photolithography, it is difficult to completely remove the metal since the metal starts to react with amorphous silicon as soon as it is deposited. That is, as explained above, the reason why nickel (metal) layer patterns are defined using photoresist in the present invention is to prevent reaction between nickel (metal) and amorphous silicon.

Figure 3E:
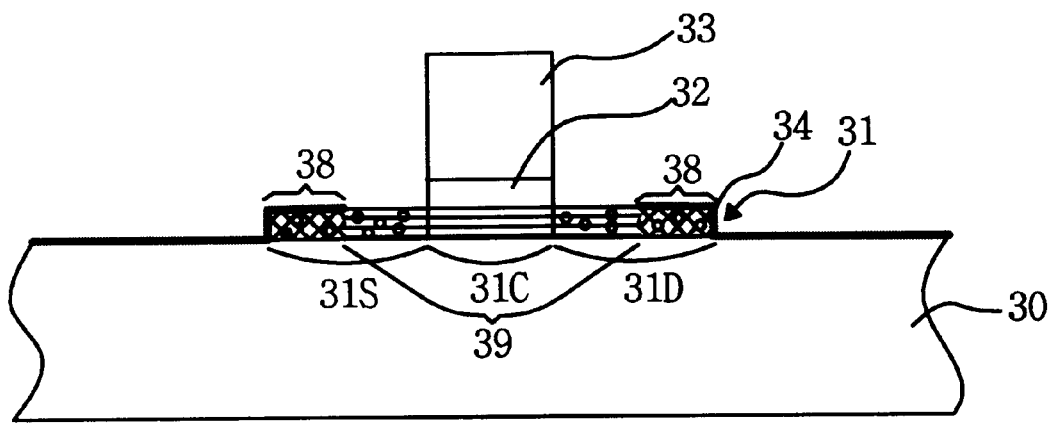

Referring to FIG. 3E, the formed structure is thermally heated in a furnace at a temperature of 300° C. to 500° C. wherein crystallization of amorphous silicon proceeds. During the process of crystallizing amorphous silicon, portions of the active layer 31 having the nickel layer 34 thereon are crystallized by MIC, while nickel off-set and channel regions 37 and 31C are crystallized by MILC. Hence, the portion having nickel thereon in portions of the source/drain region 31S and 31D becomes an MIC region 39, and the channel region 31C (nickel off-set region) and portions of the source/drain region 31S and 31D become an MILC region 39.

The boundaries between the MIC and MILC regions 38 and 39 are located outside the channel region, for example, within the source and drain regions 31S and 31D. The crystalline structure of silicon near such junctions (boundaries) is homogeneous. Thus, compared to the conventional art, traps caused by the changed crystalline structure of silicon near the junctions are prevented.

FIG. 4A to FIG. 4D show a method of fabricating an MILC TFT according to a second embodiment of the present invention.

Figure 4A:
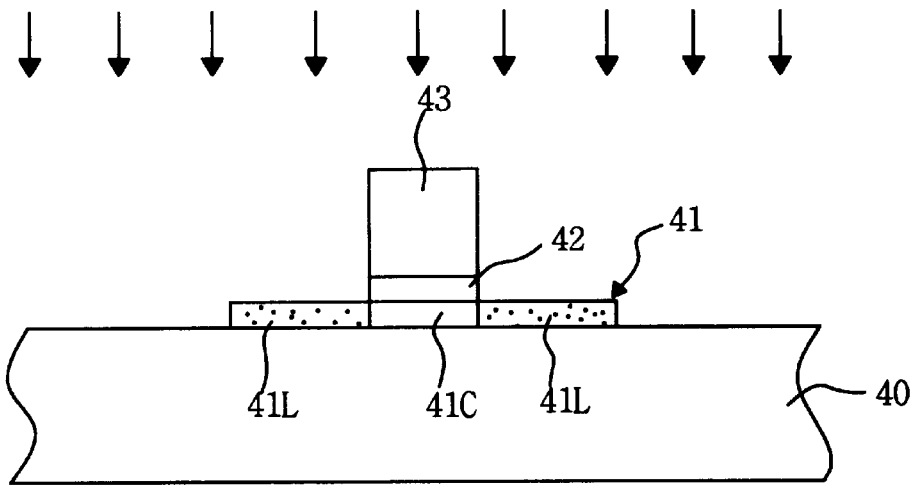
FIG. 4A to FIG. 4D show a method of fabricating an MILC TFT according to a second embodiment of the present invention.

Referring to FIG. 4A, an active layer 41 is formed by depositing amorphous silicon on an insulation substrate 40. A gate insulating layer 41 and a gate electrode 43 are formed on the active layer 41. The active layer 41 is lightly doped with impurities by applying a lightly doping process on the entire surface of the formed structure wherein the gate electrode 43 functions as a doping mask against dopants. Reference numeral 41L denotes a lightly doped region in the active layer 41 and 41C denotes a channel region of the TFT.

Figure 4B:
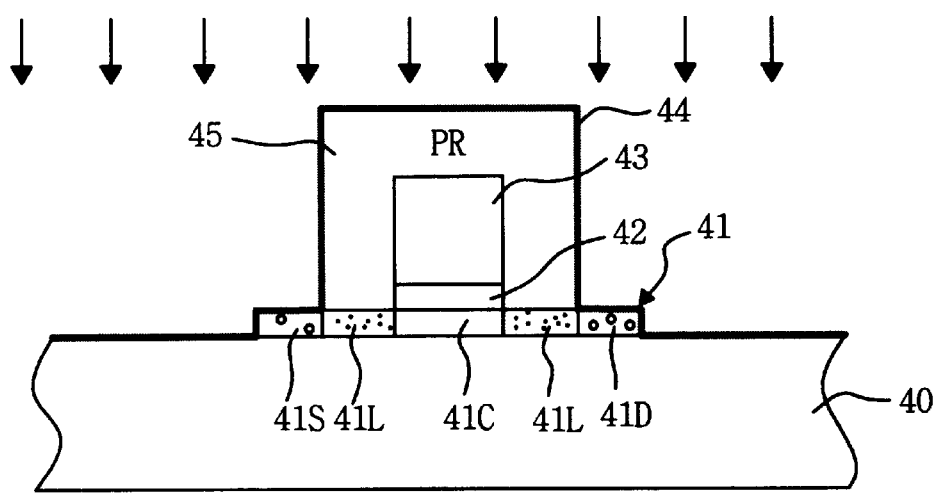

Referring to FIG. 4B, a photoresist pattern 45 is defined by patterning photoresist PR coated on the entire surface of the substrate using photolithography. Here, the photoresist pattern 45 extends farther than the gate electrode 43 by 0.02 μm to 10 μm but other suitable dimensions can be used. A metal layer, such as a nickel layer 44, is formed to a thickness of 20 Å to 200 Å by sputtering. Then a source region 41S and a drain region 41D are formed by doping heavily portions of the lightly doped regions 41L of the active layer 41 using the photoresist pattern 45 as a mask.

Figure 4C:
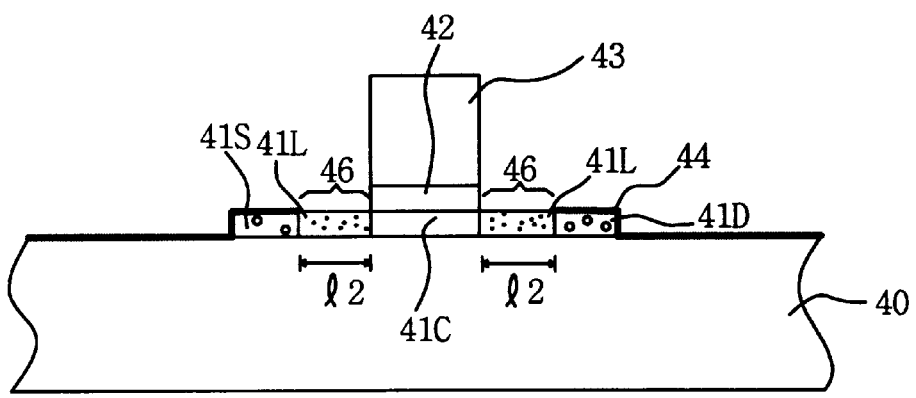
Figure 4D:
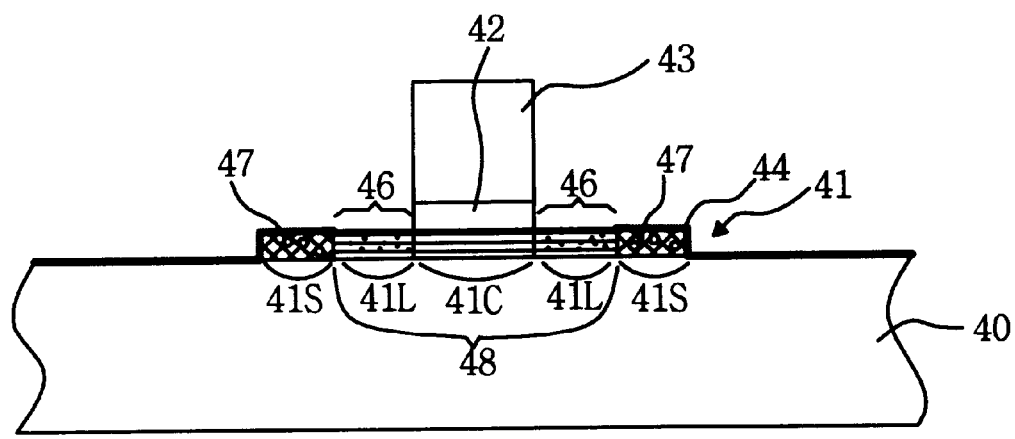

Referring to FIG. 4C, the photoresist pattern 45 is removed by a LIFT-OFF process. This forms nickel off-set regions 46 each having a length l2 of 0.01 μm to 5 μm. Portions of the nickel layer 44 still remain over the source and drain regions 41S and 41D and on portions of the substrate 40.

Referring to 4D, amorphous silicon is crystallized when the substrate is heated under the temperature of 300° C. to 500° C. in a furnace. A part of the active layer 41 having the nickel layer 44 thereon is crystallized by MIC, whereas the nickel off-set regions 46 and the channel region 41C are crystallized by MILC. Hence, the source/drain regions 41S and 41D become MIC regions 47, and the channel and lightly doped regions 41C and 41L become an MILC region 48. The activation and crystallization of the impurity proceeds in the source and drain regions 41S and 41D.

In the second embodiment of the present invention, the boundaries between the MIC and MILC regions having different crystal structures are located outside the channel region 41C. Thus the silicon structures near such junctions are the same or substantially the same. This eliminates traps caused by the change in the crystalline structure.

If the lightly doped step described referring to FIG. 4A is skipped but the subsequent steps described referring to FIGS. 4B–4C are performed, the lightly doped regions 41L become impurity off-set regions having no dopant therein. A thin film transistor fabricated by this modified method also prevents formation of traps.

FIG. 5A to FIG. 5D show a method of fabricating an MILC TFT according to a third embodiment of the present invention.

Figure 5A:
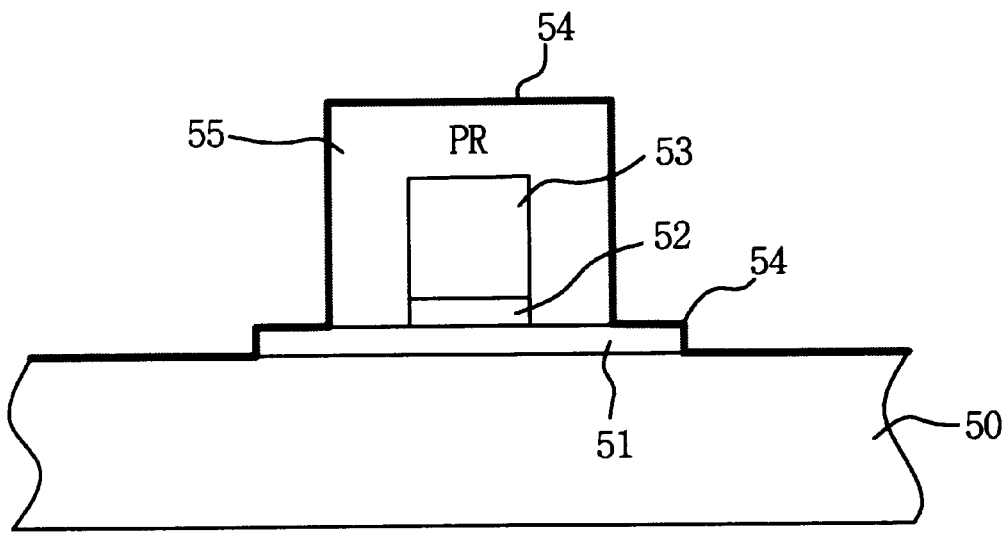

Referring to FIG. 5A, an active layer 51 is formed on an insulation substrate 50 by depositing and patterning amorphous silicon. A gate insulating layer 52 and a gate electrode 53 are formed on the active layer 51. A photoresist pattern 55 extending beyond the gate electrode 53 by 0.02 μm to 10 μm is formed by patterning photoresist PR coated on the entire surface of the substrate 50. Over the formed structure, a metal layer, such as a nickel layer 54, is formed to a thickness of 20 Å to 200 Å by sputtering nickel.

Figure 5B:
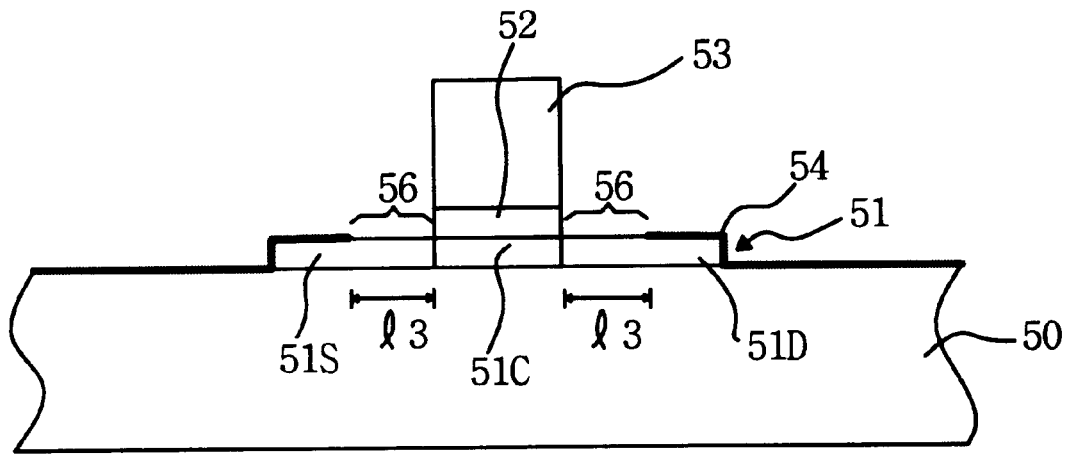

Referring to FIG. 5B, nickel off-set regions 56 are formed at certain portions of the active layer 51 by removing the photoresist pattern 55 by a LIFT-OFF process through which portions of the nickel layer 54 covering the surface of the photoresist pattern PR are also removed. The length l3 of each nickel off-set region 56 is 0.01 μm to 5 μm since the photoresist pattern 55 extends more than the gate electrode 52 by 0.02 μm to 10 μm.

Figure 5C:
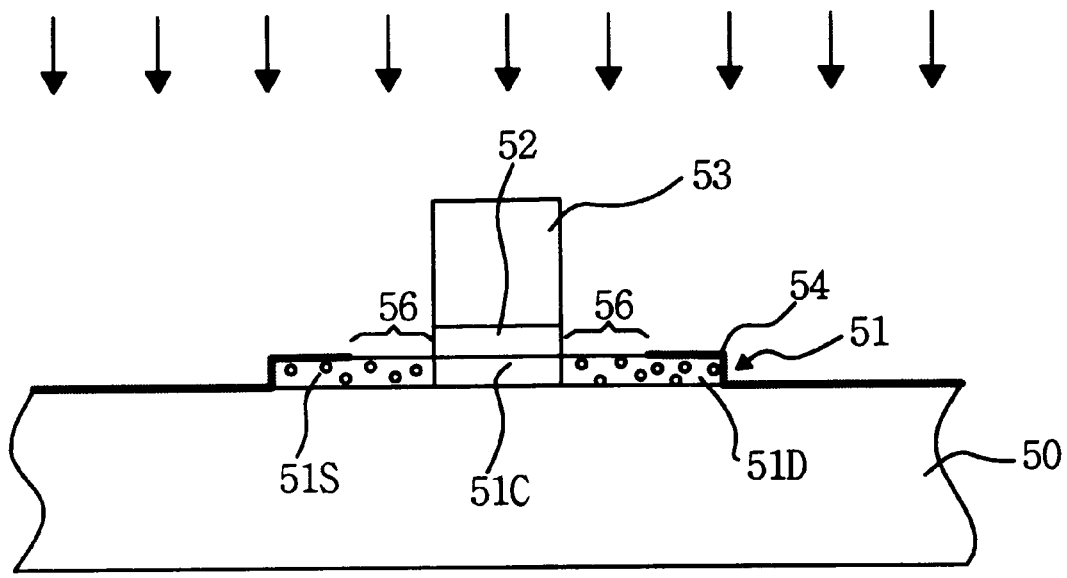

Referring to FIG. 5C, source and drain regions 51S and 51D are formed in the active layer 51 by doping heavily the entire surface of the formed structure with impurities. The gate electrode 53 functions as a blocking mask in this doping step. The impurities pass through the thin nickel layer 54 and reach the silicon layer 51. Reference numeral 51C denotes a channel region of the transistor.

Referring to FIG. 5D, amorphous silicon of the active layer 51 is crystallized when the formed structure is heated in a furnace at a temperature of 300° C. to 500° C. In the process of crystallizing amorphous silicon, the amorphous silicon in the active layer 51 having the nickel layer 54 thereon is crystallized by MIC to form MIC regions 57, and the nickel off-set regions 56 having no nickel layer 54 thereon are crystallized by MILC to form an MILC region 58. In other words, portions of the source and drain regions 51S and 51D with the nickel layer 54 thereon are crystallized by the MIC process, whereas the channel region 51C and the nickel off-set regions 56 in the source and drain regions 51S and 51D (i.e., with no nickel layer 54) are crystallized by the MILC process.

FIG. 6A to FIG. 6D show a method of fabricating an MILC TFT according to a fourth embodiment of the present invention.

Referring to FIG. 6A, an active layer 61 is formed on an insulation substrate 60 by depositing and patterning amorphous silicon. Then a gate insulating layer 62 and a gate electrode 63 are formed on the active layer 61. A photoresist pattern 65 extending more than the gate electrode 63 by 0.02 μm to 10 μm is formed by patterning photoresist PR coated on the entire surface of the formed structure. A metal layer, such as a nickel layer 64, is then formed to a thickness of 20 Å to 200 Å by sputtering nickel on the formed structure.

Referring to FIG. 6B, source and drain regions 61S and 61D are formed within the active layer 61 by doping heavily the entire surface of the formed structure with impurities, using the photoresist pattern 65 as a blocking mask. The impurities pass through the thin nickel layer 64 and reach end portions of the silicon layer 61. Reference numerals 61C and 61F denote a channel region and doping off-set regions protected from the impurities by the photoresist pattern 65, respectively.

Figure 6C:
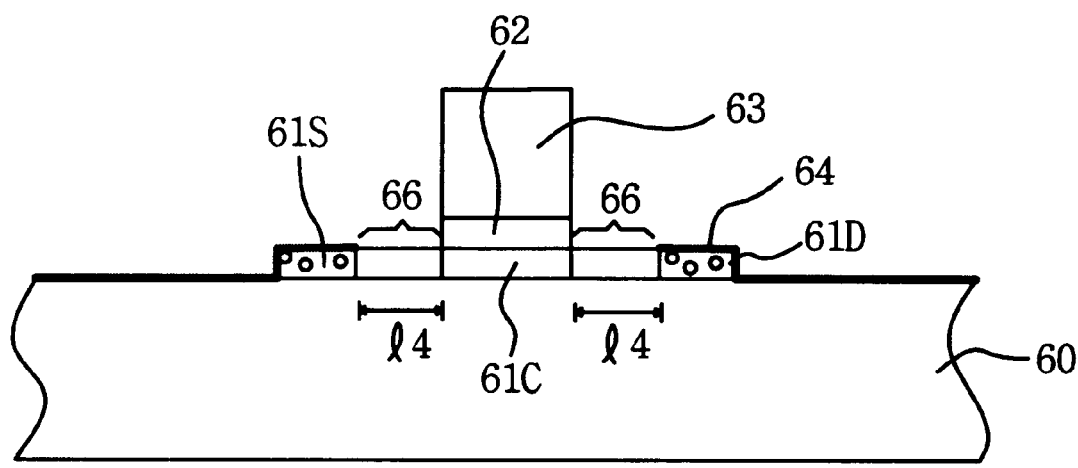

Referring to FIG. 6C, nickel off-set regions 66 are formed on portions of the active layer by removing the photoresist pattern 65 using a LIFT-OFF process through which portions of the nickel layer 64 covering the surface of the photoresist pattern 65 is also removed. This creates nickel off-set regions 66 which are the doping off-set regions without the nickel layer 64 formed thereon. The length l4 of each nickel off-set region 66 ranges from 0.01 μm to 5 μm since the photoresist pattern PR is longer than the gate by 0.02 μm to 10 μm.

Figure 6D:
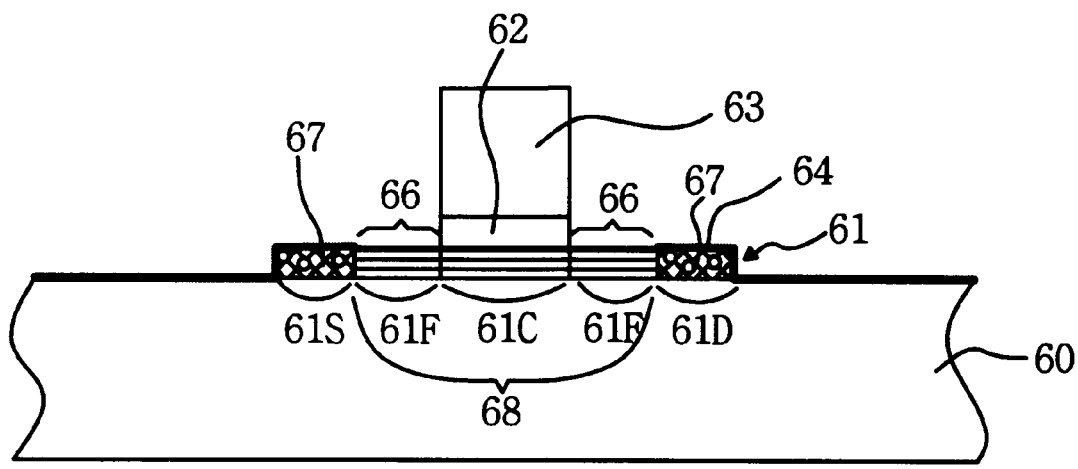

Referring to FIG. 6D, amorphous silicon is crystallized when the formed structure is heated in a furnace at a temperature of 300° C. to 500° C. In the process of crystallizing the amorphous silicon, the amorphous silicon in the active layer 61 having the nickel layer 64 thereon is crystallized by MIC to form MIC regions 67, and the nickel off-set regions 66 having no nickel layer 64 thereon are crystallized by MILC to form an MILC region 68. In other words, portions of the source and drain regions 61S and 61D having the nickel layer 64 thereon are crystallized by the MIC process, whereas the channel region 61C and the doping off-set regions 61F having no nickel layer 64 are crystallized by the MILC process.

The boundaries between the MIC and MILC regions are placed outside the channel region in the third and fourth embodiments as in the first and second embodiments. Thus the crystalline structure of silicon near such junctions is homogeneous. Compared to a conventional art, traps caused by the changed crystalline structure of silicon near the junctions are then diminished or eliminated.

Figure 7:
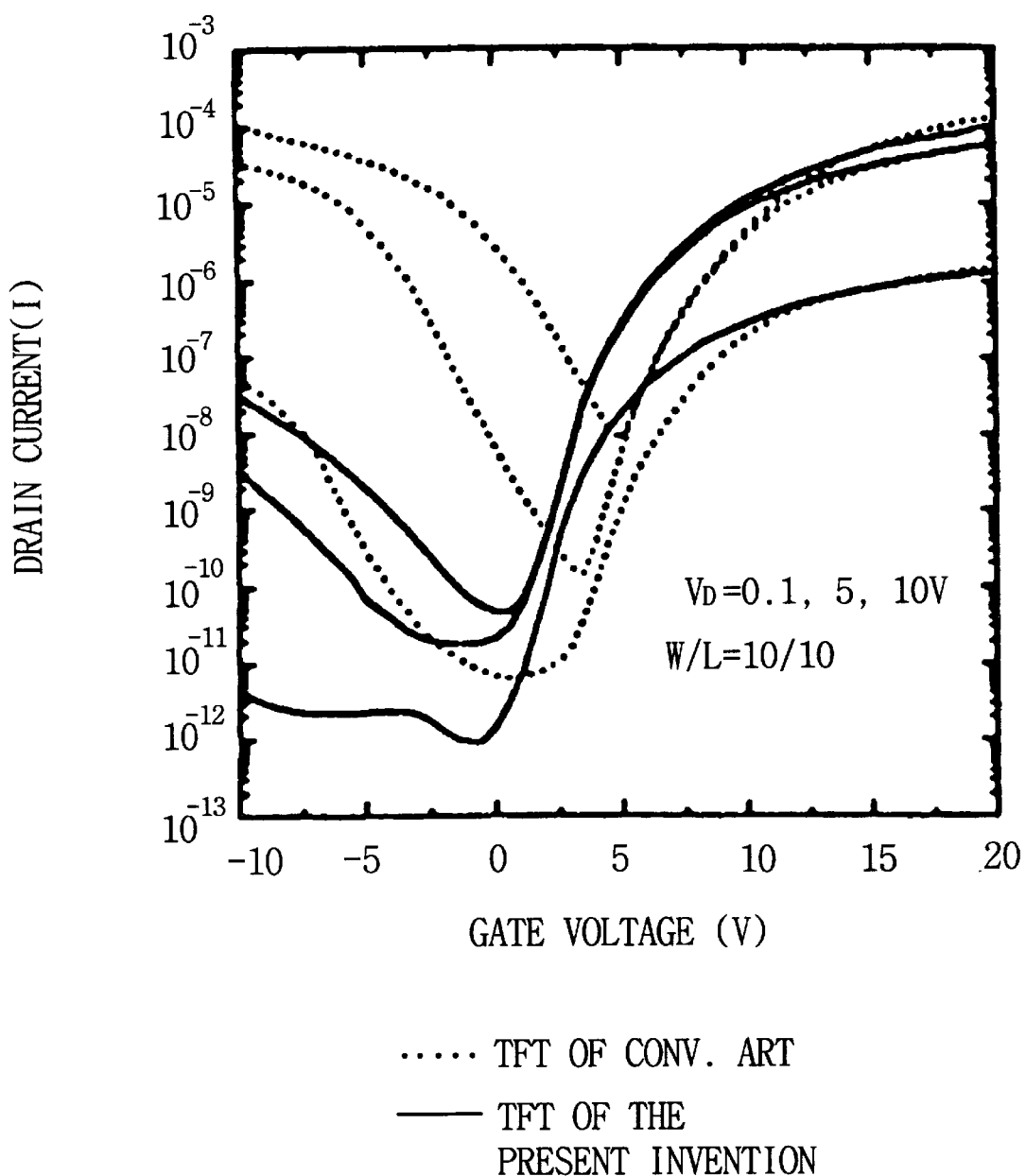
FIG. 7 shows a graph showing a relation between a drain current and a gate voltage for TFTs according to a related art and to the present invention.

FIG. 7 shows a graph comparing the characteristics of TFTs according to a conventional art with the characteristics of TFTs according to the present invention. This exemplary graph shows a relationship between drain current I and gate voltage V of a conventional TFT and a TFT fabricated according to the present invention. According to the graph, the present invention TFT as a sample has been processed with heat treatment at a low temperature of under 500° C. for 15 hours wherein the W/L (width/length of channel region) ratio is 10 μm/10 μm. The length of a nickel off-set region of a TFT of the present invention used in the experiment is about 2.5 μm.

As it is seen in the experiment, the TFT fabricated by the present invention has less leakage current than the conventional TFT made by MILC in cases where drain voltages $V_D$ are such as 0.1, 5 and 10 V. Specially, the on/off ratio of the leakage current is relatively high at the drain voltage of 10 V.

Figure 8:
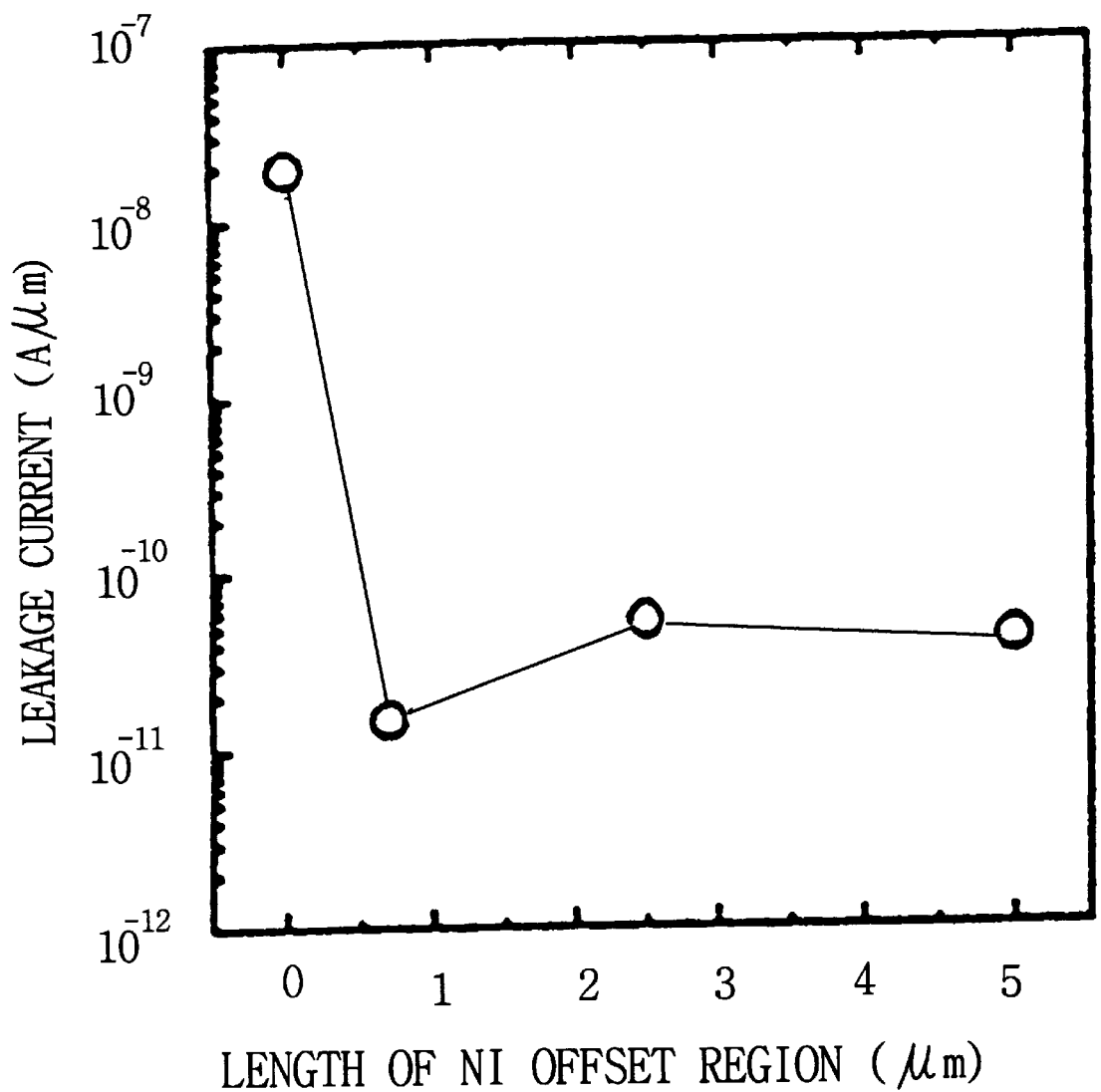
FIG. 8 shows a graph showing a relation between leakage current and the length of a nickel off-set region according to the present invention.

FIG. 8 show characteristic changes of leakage current based on the length of a nickel off-set region where the gate voltage and the drain voltage of the TFT according to the present invention are set at 0 V and 15 V, respectively.

As shown in FIG. 8, the leakage current values are low where the length of the nickel off-set region is between 0.01 μm and 5 μm. For example, the value of leakage current decreases substantially as the length of the nickel (NI) off-set region increases from 0.0 μm to 0.7 μm.

Hence, the leakage current is decreased by controlling the length of the nickel off-set regions of the TFT according to the invention.

In the present invention, traps caused in the junctions between the channel region and the source and drain regions are reduced or eliminated by having boundaries between MIC and MILC regions outside the channel region. This decreases the leakage current from the thin film transistor as well. Hence, the present invention provides a stable channel region and improves the characteristics of a thin film transistor.

It will be apparent to those skilled in the art that various modifications and variations can be made in thin film transistors and fabricating method of the present invention without departing from the spirit or scope of the inventions. Thus, it is intended that the present invention cover the modifications and variations of this invention provided they come within the scope of the appended claims and their equivalents.

What is claimed:

1. A transistor comprising:
   an MILC (metal-induced lateral crystallization) region formed on a substrate with a semiconductor material and including a channel region; and
   a plurality of MIC (metal-induced crystallization) regions formed on sides of the MILC region with a semiconductor material, wherein at least one boundary between the MILC region and one of the MIC regions is located outside the channel region.

2. The transistor according to claim 1, wherein the MILC region includes heavily doped regions formed on sides of the channel region.

3. The transistor according to claim 1, wherein the MILC region includes lightly doped regions formed on sides of the channel region.

4. The transistor according to claim 1, wherein the MILC region includes side portions formed on sides of the channel region, a length of each of the side portions ranging from 0.01 μm to 5 μm.

5. The transistor according to claim 1, wherein the MILC regions includes source and drain regions.

6. The transistor according to claim 1, wherein the MILC region includes no dopant portions formed on sides of the channel region.

7. A transistor comprising:
   a channel region;
   a source region having a first source portion adjacent to the channel region and a second source portion adjacent to the first source portion; and
   a drain region having a first drain portion adjacent to the channel region and a second drain portion adjacent to the first source portion;
   wherein the channel region and at least one of the first source portion and the first drain portion comprise a metal-induced lateral crystallization region.

8. The transistor of claim 7, wherein the second source portion comprises a metal-induced crystallization region.

9. The transistor of claim 7, wherein the second drain portion comprises a metal-induced crystallization region.

10. The transistor of claim 7, wherein at least one of the source and drain regions includes a lightly doped region.

11. The transistor of claim 7, wherein the source and drain regions are heavily doped.

12. The transistor of claim 7, wherein a length of the first source portion is between approximately 0.01 microns and approximately 5 microns.

13. The transistor of claim 7, wherein a length of the first drain portion is between approximately 0.01 microns and approximately 5 microns.

14. The transistor of claim 7, wherein the channel region, the first source portion and the first drain portion comprise the metal-induced lateral crystallization region, the second source region comprises a metal-induced crystallization region, and the second drain region comprises a metal-induced crystallization region.

15. The transistor of claim 7, wherein the first source portion and the second source portion have different concentrations of impurities.

16. The transistor of claim 7, wherein the first drain portion and the second drain portion have different concentrations of impurities.

* * * * *